United States Patent [19]

Ecklund et al.

[11] Patent Number: 4,733,200

[45] Date of Patent: Mar. 22, 1988

[54] CONTROLLED FEEDBACK PATH VOLTAGE CONTROLLED OSCILLATOR

[75] Inventors: Lawrence M. Ecklund, Wheaton; Charles J. Marik, Richmond, both of Ill.

[73] Assignee: Motorola, Inc., Schaumburg, Ill.

[21] Appl. No.: 918,943

[22] Filed: Oct. 14, 1986

[51] Int. Cl.$^4$ .......................... H03B 5/12; H03B 5/36
[52] U.S. Cl. ............................ 331/116 R; 331/117 R; 331/177 R
[58] Field of Search ........ 331/116 R, 116 FE, 117 R, 331/117 FE, 158, 167, 177 R, 177 V

[56] References Cited

U.S. PATENT DOCUMENTS

| | | | |
|---|---|---|---|
| 4,055,817 | 10/1977 | Watanabe et al. | 331/117 R |
| 4,286,235 | 8/1981 | Wilber et al. | 331/116 R |
| 4,595,887 | 6/1986 | Miura | 331/8 |
| 4,600,899 | 7/1986 | Kennedy | 331/177 R X |

Primary Examiner—Siegfried H. Grimm
Attorney, Agent, or Firm—Steven G. Parmelee

[57] ABSTRACT

A voltage controlled oscillator having a first feedback path and a second feedback path. The first feedback path may include a phase shift unit (13) as necessary to compensate for an inherent phase shift provided by the resonant circuit (11) used therewith. The second feedback path includes a steering network (17) that responds to an external control signal to cause the output signal to be selectively in either of two phase relations with respect to the incoming signal. The control signal can also control the magnitude of the output signal. By control of the phase relationship and the magnitude, the steering network (17) can effectively control the output frequency of the resonant circuit (11).

16 Claims, 8 Drawing Figures

CONTROLLED FEEDBACK PATH VOLTAGE CONTROLLED OSCILLATOR

TECHNICAL FIELD

This invention relates generally to voltage controlled oscillators, and particularly to voltage controlled oscillators that have at least two feedback paths for supporting oscillation at a desired frequency.

BACKGROUND ART

Voltage controlled oscillators of various kinds are known in the art. In general, such devices operate to provide a signal having a frequency that depends, at least in part, on an input control voltage. Such devices have many applications. For instance, in an AM stereo radio receiver, voltage controlled oscillators provide station tuning and average IF frequency for signal recovery functions.

Many applications require a voltage controlled oscillator having an accurate output over a relatively wide tuning range. One prior art approach intended to meet this need provides a resonant circuit, such as an inductor-capacitor pair, that connects to both a phase shifting network and a steering network. The phase shifting network operates to phase shift 135 degrees a fed back oscillator signal (subsequent signal processing in the feedback loop results in a total effective phase shift of 90 degrees (for a balanced condition) to counterbalance a 90 degree phase shift that inherently occurs in the resonant circuit itself. The steering network receives an unshifted signal from an input buffer. A summing junction then sums the phase shifted signal with the output of the steering network and provides the resultant signal to the resonant circuit.

The tuning range of the above described approach will be limited by the tuning capabilities of the steering network, which in turn can effectuate no more than 90 degrees of phase control. For many applications, such a limited tuning range may be unacceptable. Further, this approach gives rise to accuracy problems even when functioning within the indicated tuning range. More particularly, as noted above, the phase shift provided by the phase shifting network approximates 135 degrees or, stated another way, 180 degrees minus 45 degrees. This typical prior art approach to phase shifting, however, requires phase shifting at a sensitive point on the frequency versus phase curve, since the slope of this curve is maximum at 45 degree positions (i.e., 45 degrees, 135 degrees, 225 degrees, etc.). Because of this, any tolerance errors in the devices utilized to accomplish the phase shift, or any errors that result do to temperature sensitivity, can give rise to significant phase errors that can in turn cause inaccurate frequency control of the voltage controlled oscillator.

There therefore exists a need for a voltage controlled oscillator capable of providing accurate frequency control over a relatively wide tuning range.

SUMMARY OF THE INVENTION

These needs and others are substantially met through provision of the voltage controlled oscillator described in this specification. This voltage controlled oscillator includes generally a resonant circuit, a first feedback path, a second feedback path, and a summing junction.

The resonant circuit functions to resonate at a resonant frequency and to provide an oscillator output signal having a desired frequency. The resonant circuit also has an input for receiving a feedback signal that induces oscillation at the desired frequency The first feedback path receives the oscillator output signal and provides this signal to the summing junction in independent closed loop fashion. As may be appropriate to the particular embodiment realized, the signal so provided to the summing junction through the first feedback path may be waveform modified to yield effective and controllable results.

The second feedback path also receives the oscillator output signal. This feedback path, however, includes a steering network that also receives an externally provided control signal, which control signal effectively provides external control of the second feedback path. The steering network functions to control the frequency of oscillation of the resonant circuit. To accomplish this, the steering network provides an output signal in phase with the incoming oscillator output signal, or, in the alternative, selectively provides an output signal 180 degrees out of phase with respect to the oscillator output signal. The control signal provided to the steering network determines which phase relationship will be maintained. In addition, the control signal determines the amplitude of the steering network output signal.

This resultant signal from the steering network connects to the summing junction. As indicated above, the summing junction receives the output signals from both feedback paths. These feedback signals are summed at the summing junction to provide a combined feedback signal. The resonant circuit uses this feedback signal to effectuate the oscillation function. The signal from the second feedback path dictates the frequency at which the resonant circuit will oscillate. This signal, of course, is in turn determined by the control signal provided to the steering network.

The above configuration provides a number of benefits. By use of a steering network that can select either of two predetermined phase relationships, a wider steering range can be achieved than through previous prior art approaches. In fact, nearly twice the steering range can be achieved by use of the above summarized invention in comparison to prior art approaches.

In one embodiment of the invention, the first feedback path also includes a phase shift component. More particularly, a 90 degree phase shift can be included to compensate for a 90 degree phase shift introduced by the resonant circuit. This 90 degree phase shift occurs through use of ordinary components without raising significant concerns regarding component tolerances or temperature sensitivity. This compares dramatically to prior art approaches that provide compensating phase shifts at critical 45 degree positions.

BRIEF DESCRIPTION OF THE DRAWINGS

These and other attributes of the invention will become more clear upon making a thorough review and study of the following description of the best mode for carrying out the invention, particularly when reviewed in conjunction with the drawings, wherein.

BEST MODE FOR CARRYING OUT THE INVENTION

Figure 1:
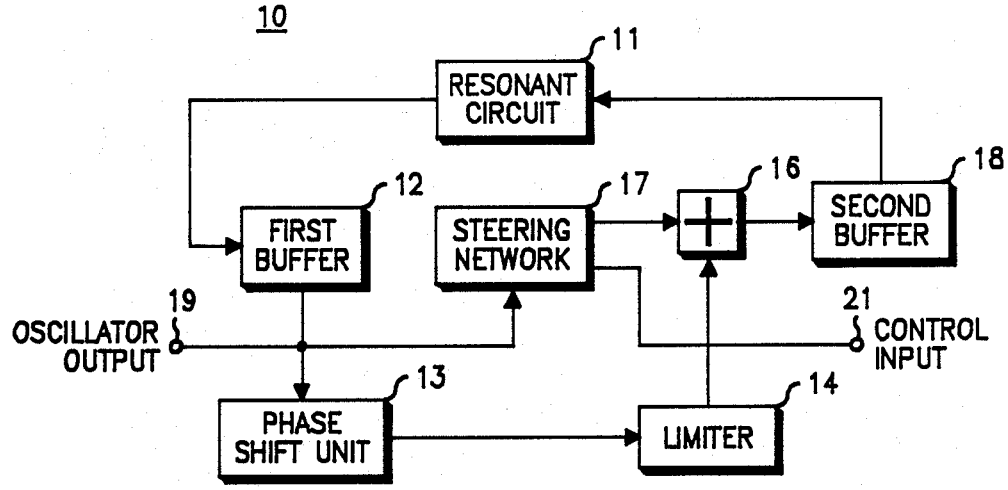
FIG. 1 comprises a block diagram view of a first embodiment of the invention.

Referring now to the drawings, and in particular to FIG. 1, a first embodiment of the invention can be seen as depicted generally by the numeral 10. This first embodiment (10) includes generally a resonant circuit (11), a first buffer (12), a phase shift unit (13), a limiter (14), a summing junction (16), a steering network (17), and a second buffer (18). The phase shift unit (13) and limiter (14) form one feedback path and the steering network (17) forms a second feedback path. The resultant feedback signals from both paths are combined at the summing junction (16) and provided through the second buffer (18) to the resonant circuit (11) to induce oscillation at a desired frequency.

Each of the above generally referred to components will now be described in more detail in seriatim fashion.

Figure 2:
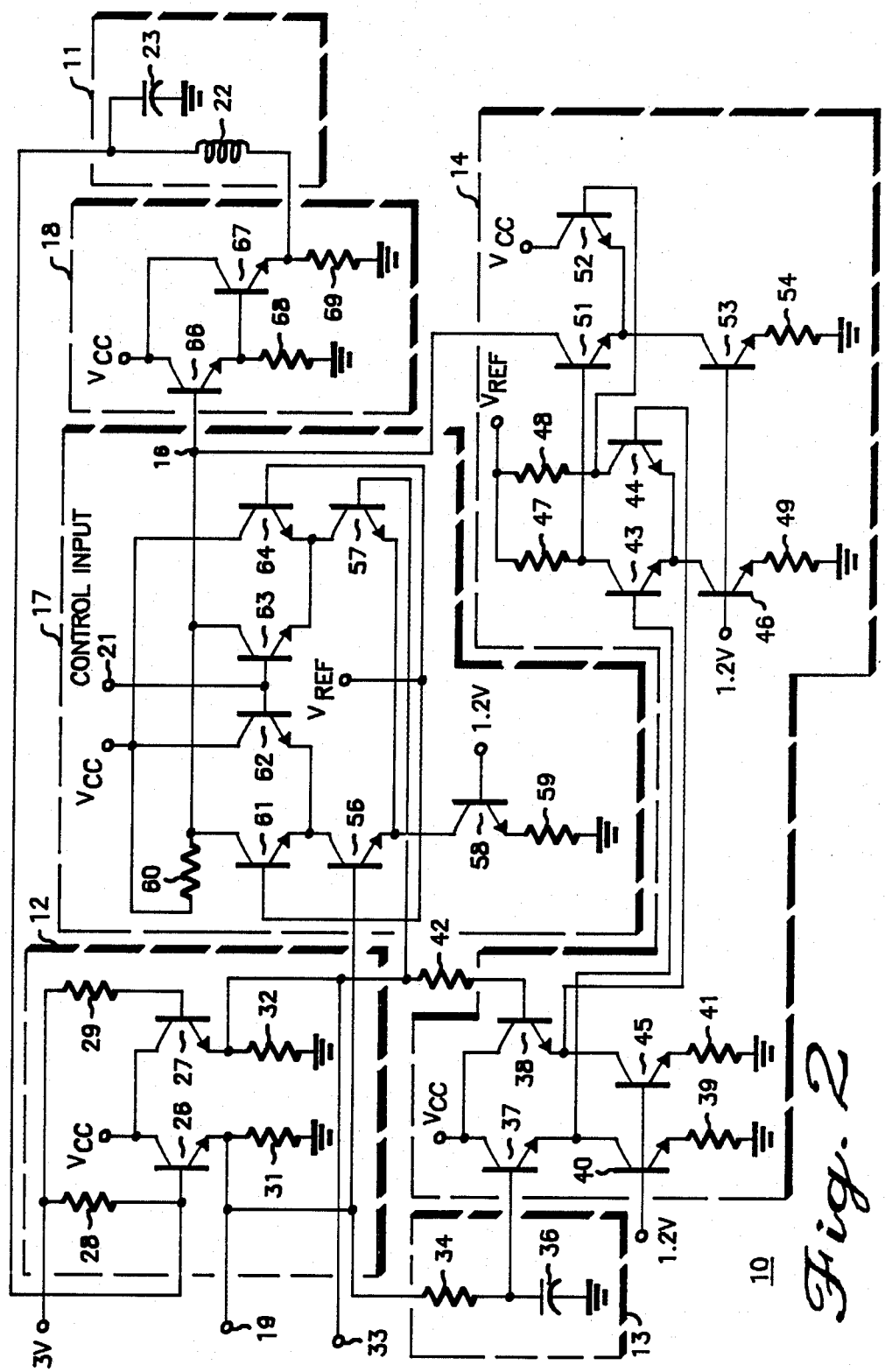
FIG. 2 comprises a schematic diagram of this first embodiment.

Referring now to FIG. 2, the resonant circuit (11) can be comprised of an inductor (22) and a grounded capacitor (23). Such a network will allow oscillation at a natural resonant frequency. The frequency of oscillation depends upon the values chosen for the inductor (22) and the capacitor (23) in accordance with well understood prior art technique. In addition, it may be noted that the network depicted will naturally introduce a 90 degree phase shift into the processing of the oscillator signal.

Figure 3:
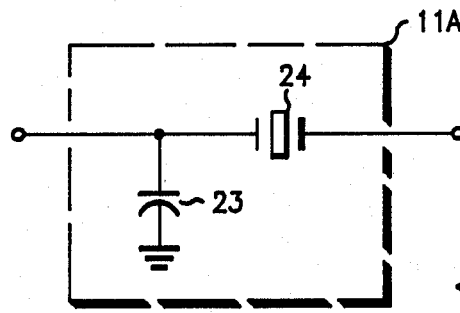
FIG. 3 comprises a schematic diagram of an alternative resonant circuit suitable for use with the first embodiment.

With momentary reference to FIG. 3, an alternative embodiment for a resonant circuit (11A) has been depicted. In this embodiment, the grounded capacitor (23) operates in conjunction with a crystal (24). Again, such components will operate in an oscillatory manner in accordance with well understood prior art technique.

Referring again to FIG. 2, the output of the resonant circuit (11) connects to the input of the first buffer (12). The first buffer (12) includes two transistors (26 and 27) and four resistors (28, 29, 31, and 32). The collectors of both transistors (26 and 27) are connected in common to $V_{CC}$ and the base for each transistor (26 and 27) connects through a 10k ohm resistor (28 and 29, respectively) to a positive three volt supply. In addition, the base of the first transistor (26) connects to receive the output of the resonant circuit (11).

The emitter of each transistor (26 and 27) connects to ground through a 22k ohm resistor (31 and 32, respectively). In addition, the emitter of the first transistor (26) comprises the oscillator output (19) (the emitter of the second transistor (27) can be connected to provide a reference line output (33) if so desired). In addition, the emitters of these transistors (26 and 27) connect to the phase shift unit (13), the limiter (14), and the steering network (17) as described below in more detail.

The phase shift unit (13) includes a 10k ohm resistor (34) and a 20 picofarad capacitor (36). This resistor (34) and capacitor (36) are connected in series between the emitter of the first transistor (26) and ground. The intersection between these two components (34 and 36) connects to the limiter (14) as described below in more detail.

The limiter (14) includes two buffers and two differential amplifiers. The two buffers are comprised of two transistors (37 and 38). Both transistors (37 and 38) have their collectors connected to $V_{CC}$. The emitter of the first transistor (37) connects to a current source comprised of a transistor (40) having its base connected to a 1.2 volt source and its emitter connected to a grounded resistor (39). The emitter of the second transistor (38) connects to another current source similarly comprised of a transistor (45) and a grounded resistor (41). The base of the first transistor (37) connects to the phase shift unit (13) as indicated above. The base of the second transistor (38) connects through a 10k ohm resistor (42) to the emitter of the first buffer second transistor (27). The emitters of both these transistors (37 and 38) connect to the limiter's first differential amplifier.

The first differential amplifier includes three transistors (43, 44, and 46). The collectors of the first two transistors (43 and 44) connect through 2.2k ohm resistors (47 and 48, respectively) to a positive 3 volt source ($V_{REF}$). The emitters of these two transistors (43 and 44) are connected in common and to the collector of the third transistor (46), the emitter of which connects to a grounded 1k ohm resistor (49). The base of this third transistor (46) connects to a 1.2 volt source. Finally, the collectors of the first two transistors (43 and 44) connect to the limiter's second differential amplifier.

The second differential amplifier also includes three transistors (51, 52 and 53). The base of the first transistor (51) connects to the collector of the first transistor (43) of the first differential amplifier. Similarly, the base of the second transistor (52) in this second differential amplifier connects to the collector of the second transistor (44) in the first differential amplifier. The emitters of the first two transistors (51 and 52) connect to the collector of the third transistor (53), the emitter of which connects to a grounded 1k ohm resistor (54) and the base of which connects to a positive 1.2 volt source. The collector of the second transistor (52) connects to $V_{CC}$. The collector of the first transistor (51) comprises the output of the limiter (14) and connects to the summing junction (16).

The steering network (17) also includes three differential amplifiers. The first differential amplifier includes two transistors (56 and 57). The base of the first transistor (56) connects to the emitter of the first transistor (26) of the first buffer (12) to thereby receive the oscillator output signal. The base of the second transistor (57) connects to the emitter of the second transistor (27) of the first buffer (12). The emitters of both transistors (56 and 57) connect to the collector of another transistor (58), the emitter of which connects to a grounded 1k ohm resistor (59) and the base of which connects to a positive 1.2 volt source. Finally, the collector of the first transistor (56) connects to the second differential amplifier and the collector of the second transistor (57) connects to the third differential amplifier, as explained below in more detail.

The second differential amplifier of the steering network (17) also includes two transistors (61 and 62). The base of the first transistor (61) connects to a positive three volt source and the base of the second transistor (62) connects to the control input (21) for the steering network (17). The collector of the first transistor (61) connects through a 680 ohm resistor (60) to $V_{CC}$ and to the summing junction (16). The collector for the second transistor (62) connects to $V_{CC}$. The emitters for both transistors (61 and 62) connect to the collector of the first transistor (56) of the first differential amplifier of the steering network (17).

The third differential amplifier of the steering network (17) again includes two transistors (63 and 64). The first transistor (63) has a base that connects to the control input (21) and a collector that connects to the summing junction (16). The second transistor (64) has a base that connects to the positive three volt source and a collector that connects to $V_{CC}$. The emitters of both transistors (63 and 64) connect to the collector of the second transistor (57) of the first differential amplifier in the steering network (17).

The summing junction (16) can be comprised of a simple node that connects as described above to the elements of the steering network (17) and the limiter (14).

The second buffer (18) can be comprised of two transistors (66 and 67) configured as a Darlington pair. The base of the first transistor (66) connects to the summing junction (16), and its emitter connects not only to the base of the second transistor (67), but also to a grounded 2k ohm resistor (68). The emitter of the second transistor (67) connects to a grounded 1k ohm resistor (69) and to the input of the resonant circuit (11).

Figure 4:
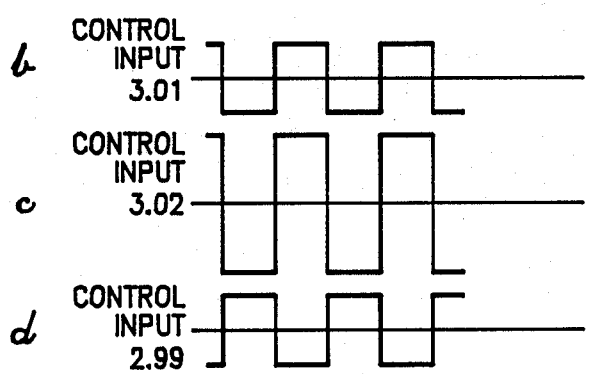
FIG. 4a–d depicts various signal outputs of the steering network of the first embodiment.

Referring now to both FIGS. 2 and 4, operation of the first embodiment (10) will be described.

When oscillating, the resonant circuit (11) will provide a sine wave output through the first buffer (12) to the oscillator output (19). This sine wave will then be provided to the phase shift unit (13), the limiter (14), and the steering network (17). The phase shift unit (13) will, in the above described embodiment, induce a phase shift of approximately 82 degrees. The direction of this phase shift will be in opposition to the phase shift inherently introduced by the resonant circuit itself (11), and hence tends to offset this inherent phase shift.

The limiter, in this embodiment, essentially provides two functions. First, as the signal from the phase shift unit (13) propagates through the limiter (14), an additional phase shift of approximately 8 degrees will result, thereby yielding a total phase shift of 90 degrees to balance and offset the 90 degree phase shift introduced by the resonant circuit (11). Second, the limiter (14) will provide at its output a square wave signal of constant amplitude, the frequency of which coincides with the frequency of the oscillator output signal. The limiter (14) provides this squared signal to the summing junction (16).

As indicated above, the steering network (17) also receives the oscillator output signal. The output of the steering network (17), however, will also be a function of the control input signal (21). For instance, with respect to the first embodiment described, and with reference to FIG. 4a, a control input signal of 3 volts will balance the various differential amplifiers of the steering network (17) and hence yield a zero amplitude output signal as depicted. Upon summing this zero amplitude signal with the output of the limiter (14) at the summing junction (16), the limiter output signal alone will be passed through the second buffer (18) to the resonant circuit (11) to stimulate and control oscillation.

With reference to FIG. 4b, upon applying a control input signal in excess of 3 volts, such as 3.01 volts, the steering network (17) will provide an in phase output signal having a measurable amplitude. This signal will be summed with the limiter output signal at the summing junction (16) prior to passing it through the second buffer (18) to the resonant circuit (11).

With reference to FIG. 4c, upon increasing the input control signal further, to 3.02 volts, the phase relationship remains unaltered but the amplitude of the signal will increase. With reference to FIG. 4d, upon reducing the control input signal to less than 3 volts, such as 2.99 volts, a 180 degree phase shift in the steering network output signal results as compared to the incoming oscillator output signal. As before, the amplitude of this 180 degree phase shifted signal can also be controlled by the amplitude of the control input signal; in this case, however, the amplitude of the signal increases as the control input signal decreases.

The control input signal therefore provides two types of steering control with respect to the steering network output signal. First, depending upon whether the control input signal is on one side or the other of a balanced condition input signal, the phase of the outgoing signal will either be in phase with the incoming signal or 180 degrees out of phase. Second, the amplitude of the outgoing signal can be controlled by controlling the amplitude of the control input signal. Therefore, phase control over a range approaching nearly 180 degrees can be effectuated by the control input signal, representing a 90 degree range increase over prior art techniques. (The embodiment depicted, of course, has a tuning range of plus and minus 45°. The resultant tuning range can be varied by varying the value of the resistor in the emitter path of the third transistor (58) associated with the first differential amplifier of the steering network (17).)

The benefits of the first embodiment (10) can be summarized as follows. First, by providing dual phase selectivity and amplitude control of the feedback signal in one feedback path, a wider tuning range for the oscillation function can be provided. Second, by providing phase shifts at relatively nonsensitive slope points (with respect to the frequency versus phase curve), the phase shifting elements can vary somewhat in tolerance and with temperature without substantially varying the operation of the circuit.

Figure 5:
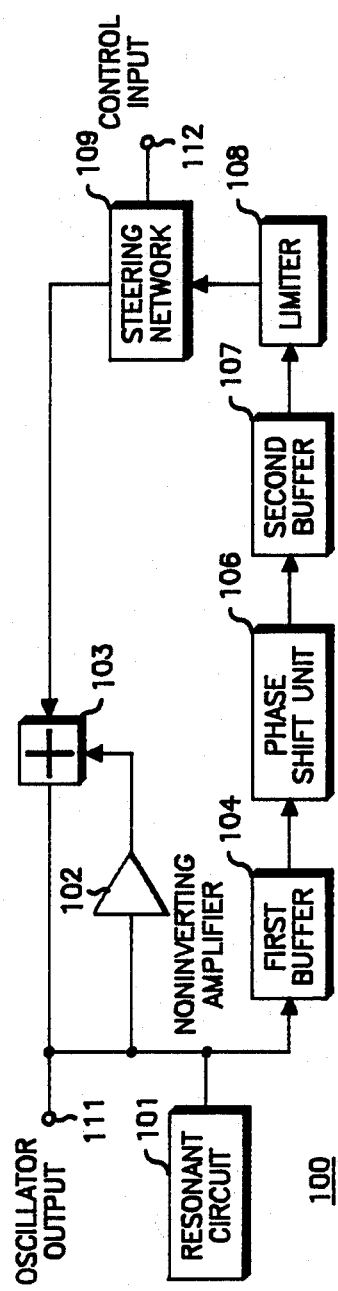
FIG. 5 comprises a block diagram view of a second embodiment of the invention.

A second embodiment of this invention will now be described with respect to FIG. 5. In this figure, the second embodiment can be seen as generally depicted by the numeral 100. This second embodiment (100) includes a resonant circuit (101), a noninverting amplifier (102), a summing junction (103), a first buffer (104), a phase shift unit (106), a second buffer (107), a limiter (108), and a steering network (109).

In general, the input and output of the resonant circuit (101) are common to one another and are provided to a first feedback path defined by the noninverting amplifier (102) and the summing junction (103). The resonator circuit output also connects to a second feedback path comprised of the first buffer (104), the phase shift unit (106), the second buffer (107), the limiter (108), the steering network (109), and the summing junction (103). An oscillator output (111) allows the oscillator output signal to be accessed, and a control input (112) allows the steering network (109) to be appropriately controlled. The above generally described components will now be described in more detail in seriatim fashion.

Figure 6:
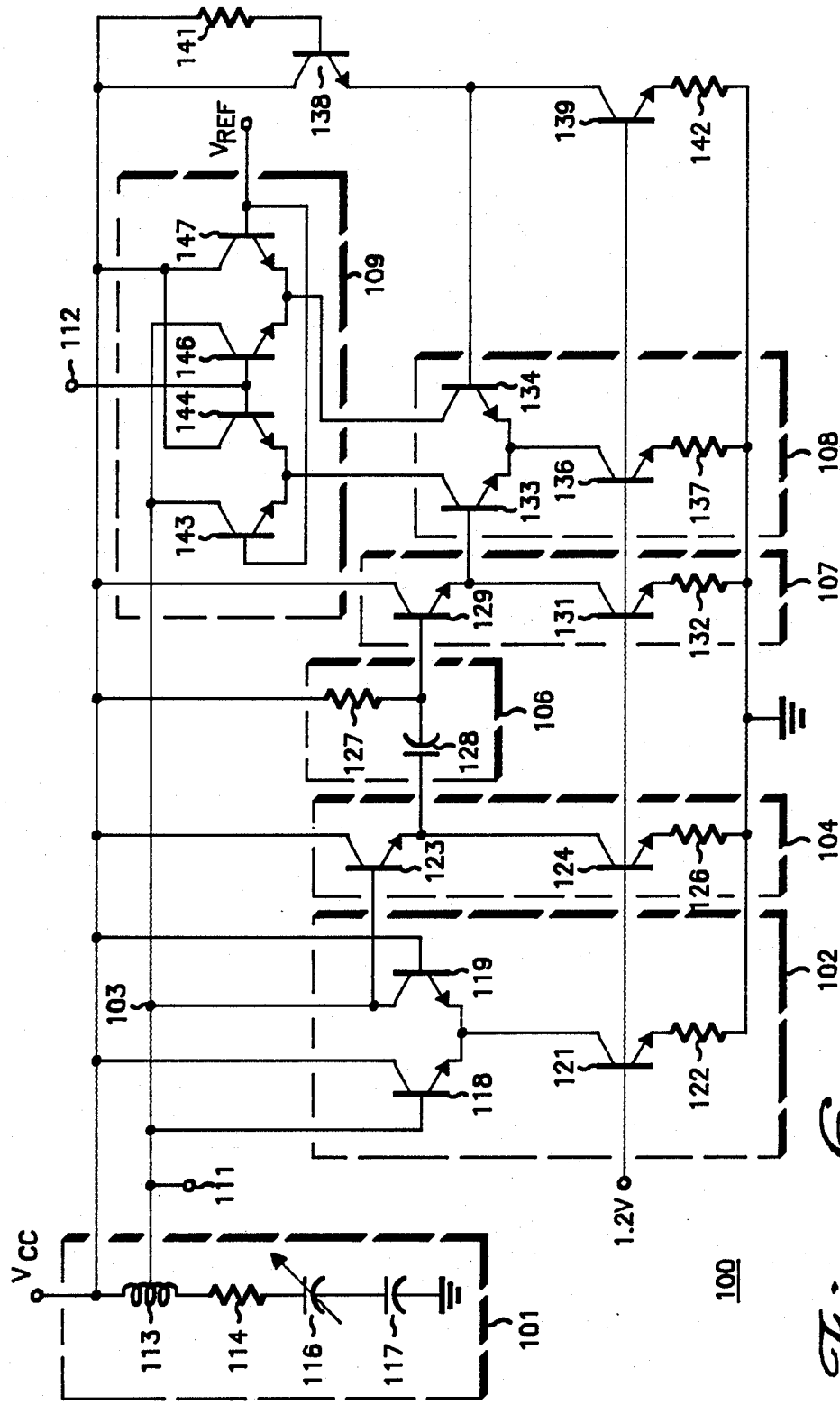
FIG. 6 depicts a schematic diagram of the second embodiment.

Referring now to FIG. 6, the resonant circuit (101) of the second embodiment (100) may be comprised of an inductor (113), a resistor (114), a variable capacitor (116), and a fixed value capacitor (117) connected in series between $V_{CC}$ and ground. This particular configuration might represent, for instance, a resonant circuit as might be found in an AM stereo radio receiver where ganged variable capacitors are utilized for tuning purposes. A tap on the inductor (113) constitutes both the input and the output for the resonant circuit (101) and connects to provide an oscillator output (111).

The noninverting amplifier (102) includes generally a differential amplifier comprised of 2 transistors (118 and 119) in addition to a current source transistor (121). The first transistor (118) of the differential amplifier has its base connected to the input/output of the resonant circuit (101) and its collector connected to $V_{CC}$. The second transistor (119) of the differential amplifier has its base connected to $V_{CC}$ and its collector connected to the summing junction (103) to thereby provide direct feedback to the input/output of the resonant circuit (101). The emitters of both transistors (118 and 119) of the differential amplifier connect to the collector of the current source transistor (121). The latter transistor (121) has an emitter that connects to a grounded resistor (122) and a base that connects to a positive reference source such as, for instance, 1.2 volts.

The first buffer (104) includes a buffer transistor (123) and a current source transistor (124). The buffer transistor (123) has its base connected to receive the output of the resonant circuit (101), its collector connected to $V_{CC}$, and its emitter connected to the phase shift unit (106) and to the collector of the current source transistor (124). The emitter of the latter connects to a grounded resistor (126), and its base connects to a positive 1.2 volt source.

The phase shift unit (106) includes a 1.8k ohm resistor (127) and a 10 picofarad capacitor (128). The capacitor (128) connects to the first buffer (104) where indicated above and also to the second buffer (107). The resistor (127) connects between the second buffer (107) and $V_{CC}$. The phase shift unit (106) provides a phase shift of approximately 90 degrees in terms of comparing the output signal to the input signal thereof.

The second buffer (107) essentially duplicates the construction of the first buffer (104). In particular, the second buffer (107) has a buffer transistor (129), the collector of which connects to $V_{CC}$ and the base of which connects to receive the output of the phase shift unit (106). The emitter of this transistor (129) connects to both the limiter (108) and the collector of a current source transistor (131). The latter has an emitter that connects to a grounded resistor (132) and a base that connects to a positive 1.2 volt source.

In this second embodiment (100), the limiter (108) includes a single differential amplifier comprised of two transistors (133 and 134) and a current source transistor (136). The first transistor (133) of the differential amplifier has its base connected to the emitter of the buffer transistor (129) of the second buffer (107). The collector of this first transistor (133) connects to the steering network (109) as disclosed in more detail below. The second transistor (134) of the differential amplifier has its base connected to a DC matching bias circuit that will be described in more detail below. The collector of this second transistor (134) connects to the steering network (109) which will also be described in more detail below. The emitters of both transistors (133 and 134) comprising the differential amplifier connect to the collector of the current source transistor (136). The latter has an emitter that connects to a grounded resistor (137) and a base that connects to a positive 1.2 volt source.

The DC matching bias circuit referred to above includes 2 transistors (138 and 139). The first transistor (138) has its collector connected to $V_{CC}$ and its base connected through a 1.8k ohm resistor (141) to $V_{CC}$. The emitter of this transistor (138) connects to the base of the second transistor (134) comprising the differential amplifier of the limiter (108) and also to the collector of the second transistor (139) of the voltage offset circuit. This second transistor (139) constitutes a current source, and has its emitter connected to a grounded resistor (142) and its base connected to a positive 1.2 volt source. This circuit essentially holds the base voltage of the second transistor (134) in the limiter (108) at the same average DC value as the second buffer (107) output.

The steering network (109) includes 2 differential amplifiers. The first differential amplifier includes 2 transistors (143 and 144). The base of the first transistor (143) connects to a reference voltage ($V_{REF}$) (which reference voltage should be less than $V_{CC}$ and greater than the emitter voltage of the voltage reference transistor (138) of the limiter (108)) and the base of the second transistor (144) connects to the control signal input (112). The collector of the first transistor (143) connects to the summing junction (103) and the collector of the second transistor (144) connects to $V_{CC}$. The emitters of both transistors (143 and 144) connect to the collector of the first transistor (133) of the differential amplifier in the limiter (108) as described above.

The second steering network differential amplifier also includes two transistors (146 and 147). The first transistor (146) has a base that connects to the control signal input (112) and a collector that connects to the summing junction (103). The second transistor (147) has a base that connects to $V_{REF}$. The collector of the second transistor (147) connects to $V_{CC}$. The emitters of both transistors (146 and 147) connect to the collector of the second transistor (134) of the differential amplifier in the limiter (108).

In the second embodiment (100), the resonant circuit (101) oscillates and produces an output signal without introduction of an inherent phase shift. Since a phase shift is not required to compensate for an inherent phase shift in the resonant circuit (101), the constant phase shift as introduced in this embodiment (100) by the phase shift unit (106) occurs in the feedback path that contains the steering network (109) (unlike the first embodiment (10) where the phase shift unit (13) does not appear in the feedback path that includes the steering network (17)).

In the second embodiment (100), the phase shift unit (106) operates to provide a phase shift that has applicability in the steering network (109) to allow phase and amplitude control of the steering network output signal in response to the control signal input (112). In this regard, the second embodiment (100) operates identically to the first embodiment (10). Further, as with the first embodiment (10), all phase shifts in the second embodiment (100) are well removed from the sensitive 45 degree phase shifts that are favored in the prior art and that carry the risk of tolerance and temperature sensitivity.

Figure 7:
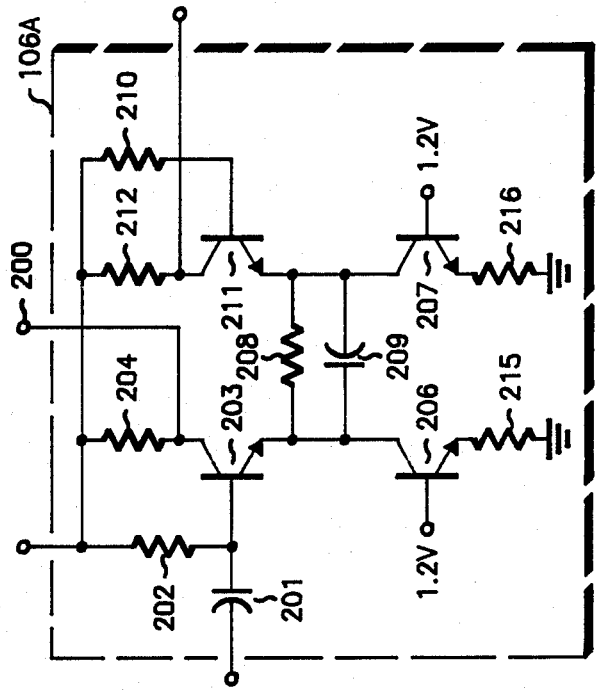
FIG. 7 comprises a schematic diagram of an alternative phase shift unit suitable for use in the second embodiment.

With reference to FIG. 7, an alternative embodiment for the phase shift unit (106) can be seen as generally depicted by the reference numeral 106A. In this embodiment, the input to the phase shift unit (106A) connects through a 7 picofarad capacitor (201) to a 2k ohm resistor (202) that connects to $V_{CC}$ and to the base of a transistor (203). The collector of this transistor (203) connects to $V_{CC}$ through a 3k ohm resistor (204) and has an emitter that connects both to a second RC network and the collector of a current source transistor (206) having a base connected to a 1.2 volt source and an emitter connected to ground through a resistor (215). The collector of this transistor (203) may also connect to the base of the DC matching bias circuit transistor (138) referred to above with respect to FIG. 6 and as designated in FIG. 7 by the reference numeral 200.

The second RC network mentioned above includes a 2k ohm resistor (208) that connects in parallel with a 7 picofarad capacitor (209). These two components (208 and 209) connect between the emitter of the above noted transistor (203) and the emitter of a second transistor (211), the collector of which constitutes the output of the phase shift unit (106A) and which also connects to $V_{CC}$ through a 3 k ohm resistor (212). The base of this transistor connects to $V_{CC}$ through a 2k ohm resistor (210) and the emitter thereof connects to the collector of a second current source transistor (207) having a base connected to a 1.2 volt source and an emitter connected to ground through a resistor (216).

In operation, the phase shift of the first RC network (201 and 202) is compensated to the extent necessary by the second RC network (208 and 209) such that the total phase shift introduced by the phase shift unit (106A) very closely approximates 90 degrees. This stable phase relationship can be maintained over a significantly useful frequency range, making this alternative embodiment attractive for use in a variety of sensitive applications.

Figure 8:
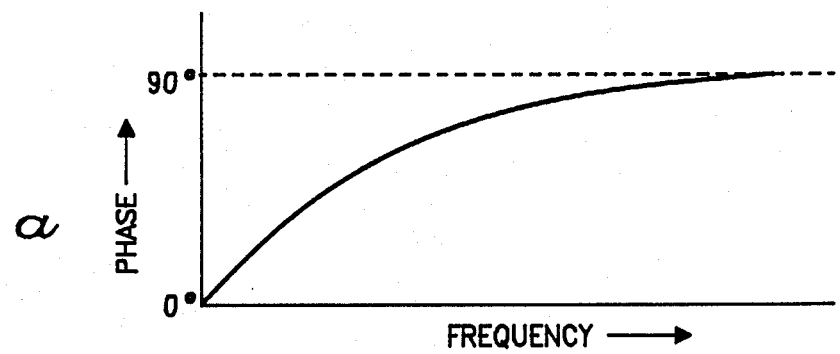
FIG. 8 comprises phase vs. frequency information regarding the alternative phase shift unit of FIG. 7.
Figure 8:
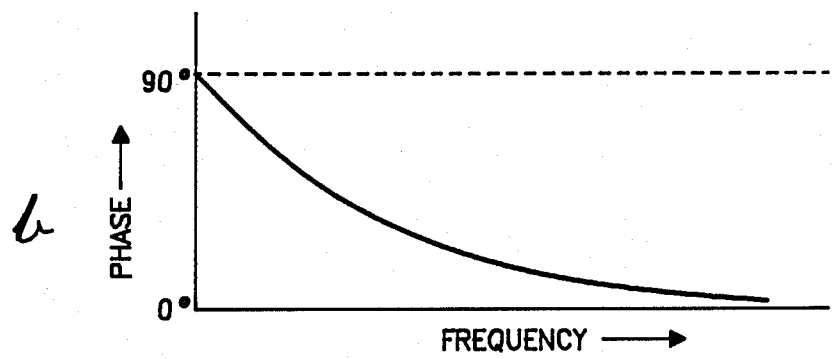
Figure 8:
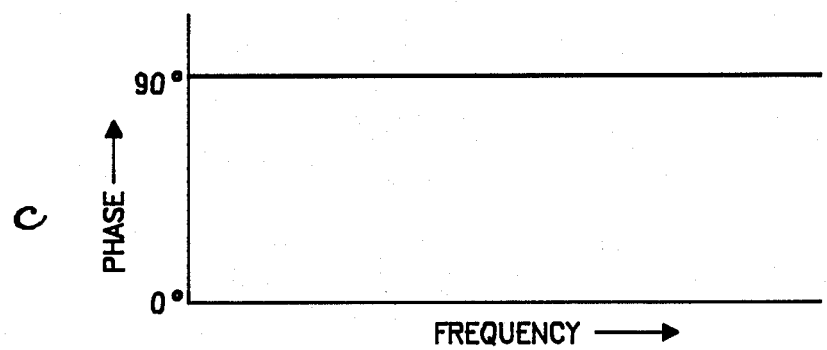

With reference to FIG. 8, the phase shift introduced by the first RC network (201 and 202) at various frequencies can be seen at FIG. 8b, and the phase shift introduced by the second RC network (208 and 209) at various frequencies can be seen at FIG. 8a. The net resultant phase shift introduced by this phase shift unit (106A) appears at FIG. 8c and comprises the sum of the phase shifts introduced by both RC networks. In effect, the first RC network comprises a first phase lead unit having a phase lead that decreases with increasing frequency, and the second RC network comprises a second phase lead unit having a phase lead that increases with increasing frequency. These phase leads balance one another to yield a constant desired phase shift, in this case 90 degrees. This results because the first RC network induces a leading voltage signal, and the second RC network induces a leading current signal. These voltage and current signals are used by the associated transistors (203 and 211) to provide the desired result.

Those skilled in the art will appreciate that the various embodiments described above could be modified and varied in accordance with the needs of a particular application without departing from the spirit of the invention. It should therefore be understood that the invention should not be considered as being limited to the precise embodiments set forth in the absence of specific limitations in the claims directed to such embodiments.

We claim:

1. A voltage controlled oscillator comprising:
   (a) resonant circuit means for resonating at a resonant frequency and having an input for receiving a feedback signal and an output for providing an oscillator output signal;
   (b) first feedback means for receiving said oscillator output signal and for providing a first feedback signal as a function of said oscillator output signal, said first feedback signal having a substantially fixed predetermined phase relationship with respect to said oscillator output signal;
   (c) second feedback means for receiving both said oscillator output signal and a control signal and for providing a second feedback signal as a function of said oscillator output signal and said control signal, such that said control signal can control when said second feedback signal has a first predetermined phase relationship with respect to said oscillator output signal and when said second feedback signal has a second and different predetermined phase relationship with respect to said oscillator output signal, wherein said second feedback means includes phase shift means for receiving said oscillator output signal and for phase shifting said oscillator output signal 90 degrees, and wherein said phase shift means includes:
   (d) first phase lead means for providing a phase lead that decreases with increasing frequency; and
   (e) second phase lead means for providing a phase lead that increases with increasing frequency;
   (f) summing means for receiving and combining said first feedback signal and said second feedback signal, and for providing said combined feedback signals to said input of said resonant circuit means, such that said oscillator output signal has a frequency that can be controlled, at least in part, by said control signal.

2. The voltage controlled oscillator of claim 1 wherein said second feedback means further functions such that said control signal can also control amplitude of said second feedback signal.

3. The voltage controlled oscillator of claim 1 wherein said resonant circuit means has an inherent phase shift.

4. The voltage controlled oscillator of claim 3 wherein said substantially fixed predetermined phase relationship of said first feedback signal is substantially equal and opposite to said inherent phase shift of said resonant circuit means.

5. The voltage controlled oscillator of claim 1 wherein said first predetermined phase relationship equals zero degrees.

6. The voltage controlled oscillator of claim 1 wherein said second predetermined phase relationship equals 180 degrees.

7. The voltage controlled oscillator of claim 1 wherein said first predetermined phase relationship equals zero degrees and wherein said second predetermined phase relationship equals 180 degrees.

8. The voltage controlled oscillator of claim 1 wherein all phase shifts introduced by said first feedback means are substantially removed from the vicinity of 45 degrees and 90 degree increments thereof.

9. The voltage controlled oscillator of claim 1 wherein all phase shifts introduced by said first feedback means are substantially in the vicinity of zero degrees and 90 degree increments thereof.

10. The voltage controlled oscillator of claim 1 wherein all phase shifts introduced by said second feedback means are substantially removed from the vicinity of 45 degrees and 90 degree increments thereof.

11. The voltage controlled oscillator of claim 1 wherein all phase shifts introduced by said second feedback means are substantially in the vicinity of zero degrees and 90 degree increments thereof.

12. The voltage controlled oscillator of claim 1 wherein all phase shifts introduced by said first feedback means and said second feedback means are substantially removed from the vicinity of 45 degrees and 90 degree increments thereof.

13. The voltage controlled oscillator of claim 1 wherein all phase shifts introduced by said first feedback means and said second feedback means are substantially in the vicinity of zero degrees and 90 degree increments thereof.

14. The voltage controlled oscillator of claim 1 wherein said phase lead of said first phase lead means and said phase lead of said second phase lead means balance one another to thereby provide said 90 degrees phase shift.

15. The voltage controlled oscillator of claim 1 wherein said first phase lead means includes a first capacitor/resistor network and said second phase lead means includes a second capacitor/resistor network.

16. The voltage controlled oscillator of claim 15 wherein said first capacitor/resistor network provides a leading voltage characteristic and said second capacitor/resistor network provides a leading current characteristic.

* * * * *